(12) United States Patent
Feng et al.

(10) Patent No.: US 9,136,154 B2
(45) Date of Patent: Sep. 15, 2015

(54) SUBSTRATELESS POWER DEVICE PACKAGES

(71) Applicant: Alpha and Omega Semiconductor Incorporated, Sunnyvale, CA (US)

(72) Inventors: Tao Feng, Santa Clara, CA (US); Zhiqiang Niu, Santa Clara, CA (US); Yuping Gong, Shanghai (CN); Ruisheng Wu, Shanghai (CN); Ping Huang, Shanghai (CN); Lei Shi, Shanghai (CN); Yueh-Se Ho, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/533,366

(22) Filed: Nov. 5, 2014

(65) Prior Publication Data
US 2015/0056752 A1    Feb. 26, 2015

Related U.S. Application Data

(62) Division of application No. 12/916,086, filed on Oct. 29, 2010, now Pat. No. 8,987,878.

(51) Int. Cl.
*H01L 21/56* (2006.01)
*H01L 23/495* (2006.01)
(Continued)

(52) U.S. Cl.
CPC ............ *H01L 21/6836* (2013.01); *H01L 21/56* (2013.01); *H01L 21/561* (2013.01); *H01L 21/563* (2013.01); *H01L 21/565* (2013.01); *H01L 21/6835* (2013.01);
(Continued)

(58) Field of Classification Search
CPC . H01L 21/56; H01L 21/563; H01L 23/49537; H01L 23/49575; H01L 25/50
USPC ............................. 438/68, 113, 114, 459, 460
See application file for complete search history.

(56) References Cited

U.S. PATENT DOCUMENTS 6,162,702 A   12/2000   Morcom et al.
6,469,398 B1  10/2002   Hori
(Continued)

FOREIGN PATENT DOCUMENTS

CN   101371345 A   2/2009
TW   200818417 A   4/2008
TW   200416970     3/2011

OTHER PUBLICATIONS

Final Office Action for U.S. Appl. No. 12/916,086, dated Feb. 8, 2013.
(Continued)

*Primary Examiner* — Phat X Cao
(74) *Attorney, Agent, or Firm* — Joshua D. Isenberg; JDI Patent

(57) ABSTRACT

A substrate-less composite power semiconductor device may be fabricated from a vertical conductive power semiconductor device wafer that includes a top metal layer located on a top surface of the wafer by a) forming solder bumps on top of the top metal layer; b) forming wafer level molding around the solder bumps such that the solder bumps are exposed through a top of the wafer level molding; c) grinding a back side of the device wafer to reduce a total thickness of a semiconductor material portion of the device wafer to a final thickness; and d) forming a back metal on a back surface of the wafer.

7 Claims, 16 Drawing Sheets

(51) Int. Cl.
| | |
|---|---|
| H01L 25/00 | (2006.01) |
| H01L 21/683 | (2006.01) |
| H01L 23/31 | (2006.01) |
| H01L 23/48 | (2006.01) |
| H01L 23/00 | (2006.01) |
| H01L 29/06 | (2006.01) |
| H01L 21/768 | (2006.01) |
| H01L 21/78 | (2006.01) |

(52) U.S. Cl.
CPC ......... *H01L 21/76897* (2013.01); *H01L 21/78* (2013.01); *H01L 23/3114* (2013.01); *H01L 23/481* (2013.01); *H01L 23/495* (2013.01); *H01L 23/49524* (2013.01); *H01L 23/49537* (2013.01); *H01L 23/49562* (2013.01); *H01L 23/49575* (2013.01); *H01L 24/11* (2013.01); *H01L 24/34* (2013.01); *H01L 24/73* (2013.01); *H01L 24/94* (2013.01); *H01L 25/50* (2013.01); *H01L 29/0657* (2013.01); *H01L 24/05* (2013.01); *H01L 24/06* (2013.01); *H01L 24/16* (2013.01); *H01L 24/29* (2013.01); *H01L 24/32* (2013.01); *H01L 2221/6834* (2013.01); *H01L 2221/68327* (2013.01); *H01L 2221/68359* (2013.01); *H01L 2221/68381* (2013.01); *H01L 2224/0401* (2013.01); *H01L 2224/04026* (2013.01); *H01L 2224/04034* (2013.01); *H01L 2224/051* (2013.01); *H01L 2224/05009* (2013.01); *H01L 2224/05025* (2013.01); *H01L 2224/05139* (2013.01); *H01L 2224/05155* (2013.01); *H01L 2224/05166* (2013.01); *H01L 2224/05571* (2013.01); *H01L 2224/0603* (2013.01); *H01L 2224/0616* (2013.01); *H01L 2224/06181* (2013.01); *H01L 2224/1184* (2013.01); *H01L 2224/16245* (2013.01); *H01L 2224/291* (2013.01); *H01L 2224/32245* (2013.01); *H01L 2224/40247* (2013.01); *H01L 2224/73253* (2013.01); *H01L 2224/73255* (2013.01); *H01L 2224/73263* (2013.01); *H01L 2224/94* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01074* (2013.01); *H01L 2924/01075* (2013.01); *H01L 2924/01079* (2013.01); *H01L 2924/01082* (2013.01); *H01L 2924/10253* (2013.01); *H01L 2924/1306* (2013.01); *H01L 2924/13091* (2013.01); *H01L 2924/14* (2013.01); *H01L 2924/2064* (2013.01); *H01L 2924/3511* (2013.01)

(56) References Cited

U.S. PATENT DOCUMENTS

| | | | |
|---|---|---|---|
| 6,774,466 | B1 | 8/2004 | Kajiwara et al. |
| 6,777,800 | B2 | 8/2004 | Madrid et al. |
| 6,870,243 | B2 | 3/2005 | Elliott et al. |
| 6,992,385 | B2 | 1/2006 | Satou et al. |
| 7,763,914 | B2 | 7/2010 | Kobayashi |
| 7,776,746 | B2 | 8/2010 | Feng et al. |
| 7,944,048 | B2 | 5/2011 | Jiang |
| 7,955,893 | B2 | 6/2011 | Feng et al. |
| 8,048,775 | B2 | 11/2011 | Feng et al. |
| 8,569,169 | B2 | 10/2013 | Ho et al. |
| 2005/0287700 | A1* | 12/2005 | Huang .......................... 438/106 |
| 2006/0186542 | A1* | 8/2006 | Wakabayashi et al. ....... 257/737 |
| 2006/0261446 | A1 | 11/2006 | Wood et al. |
| 2007/0040255 | A1 | 2/2007 | Osone et al. |
| 2008/0012119 | A1 | 1/2008 | Otremba et al. |
| 2008/0054420 | A1 | 3/2008 | Quah et al. |
| 2008/0213976 | A1* | 9/2008 | Farnworth ..................... 438/460 |
| 2009/0224313 | A1 | 9/2009 | Burke |
| 2010/0025825 | A1* | 2/2010 | DeGraw et al. ................ 257/621 |
| 2011/0241214 | A1 | 10/2011 | Feng et al. |
| 2011/0291245 | A1* | 12/2011 | Feng et al. .................... 257/621 |

OTHER PUBLICATIONS

Final Office Action for U.S. Appl. No. 12/916,086, dated Jul. 11, 2014.
Final Office Action for U.S. Appl. No. 12/916,086, dated Oct. 10, 2013.
Non-Final Office Action for U.S. Appl. No. 12/790,773, dated Feb. 26, 2014.
Non-Final Office Action for U.S. Appl. No. 12/790,773, dated Oct. 11, 2012.
Non-Final Office Action for U.S. Appl. No. 12/916,086, dated Feb. 26, 2014.
Non-Final Office Action for U.S. Appl. No. 12/916,086, dated Jun. 5, 2013.
Non-Final Office Action for U.S. Appl. No. 12/916,086, dated Sep. 26, 2012.
Non-Final Office Action for U.S. Appl. No. 13/273,219, dated Jan. 28, 2013.
Taiwanese Office Action for TW Application No. 100138877, dated Mar. 24, 2014.
U.S. Appl. No. 14/818,128, to Tao Feng, filed Aug. 4, 2015.

* cited by examiner

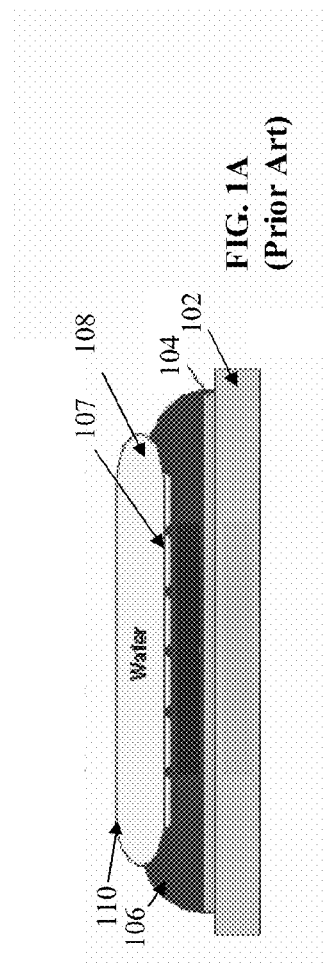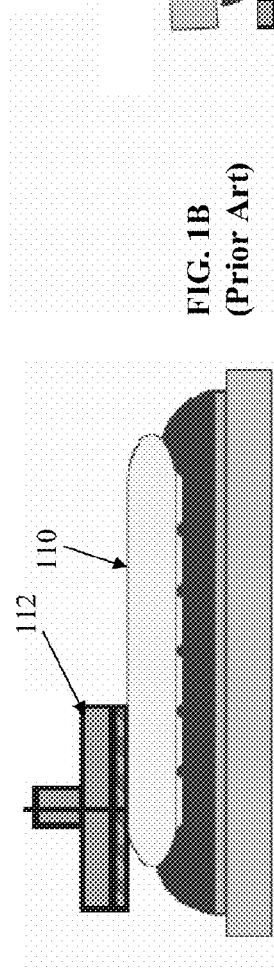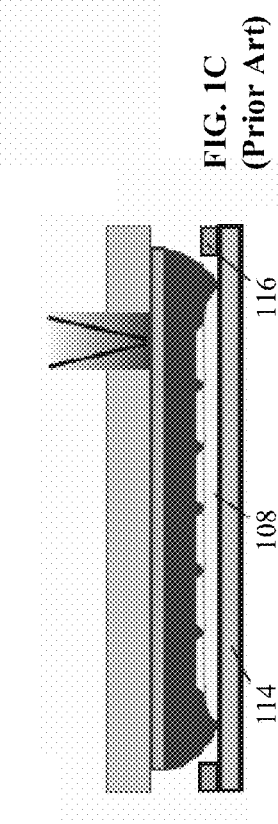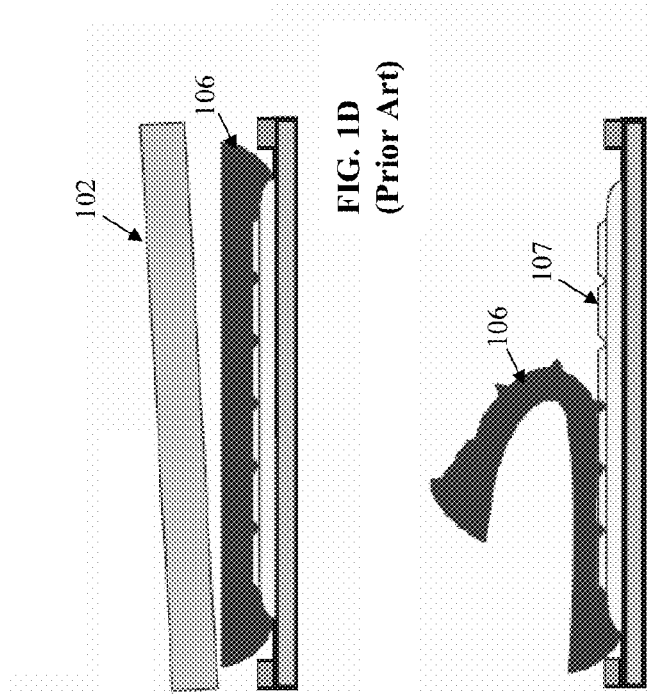
FIG. 1A (Prior Art)
FIG. 1B (Prior Art)
FIG. 1C (Prior Art)
FIG. 1D (Prior Art)
FIG. 1E (Prior Art)

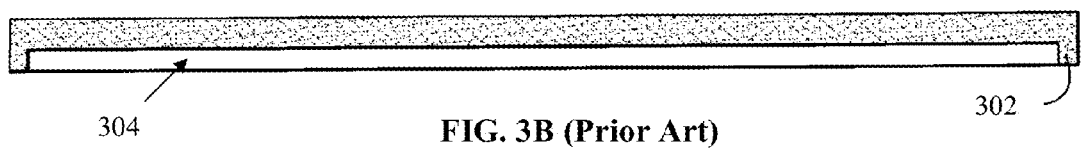
304  FIG. 3B (Prior Art)  302
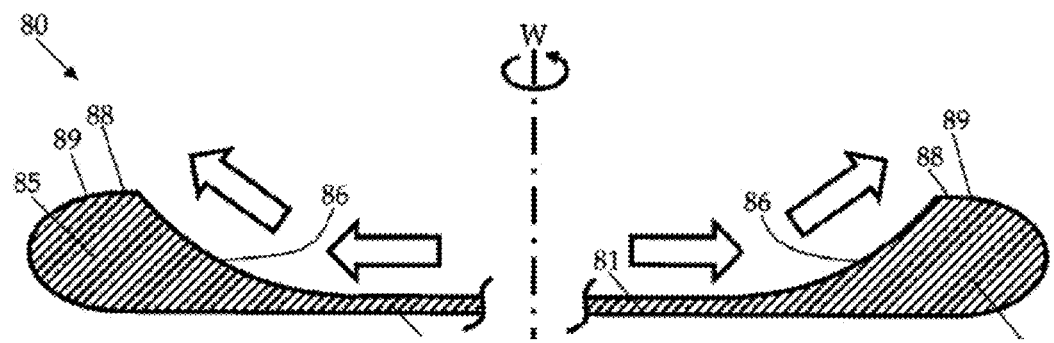
FIG. 4 (Prior Art)

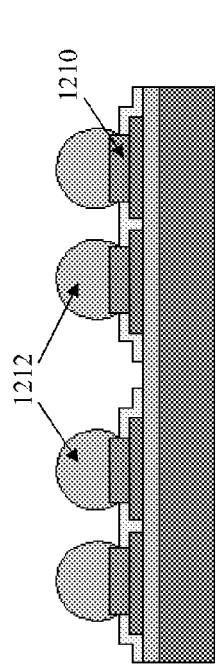
FIG. 12D
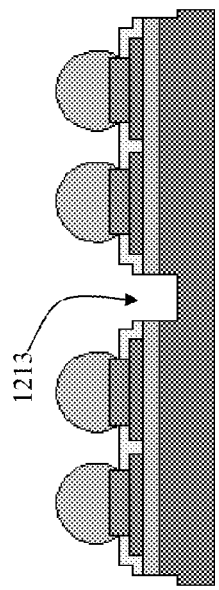
FIG. 12D1
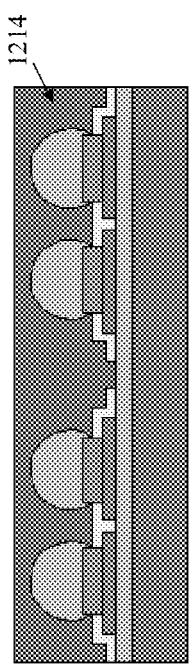
FIG. 12E
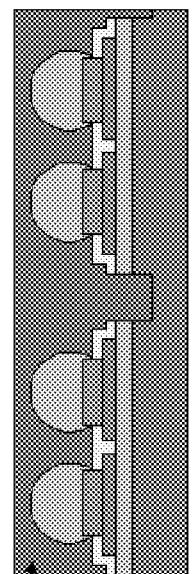
FIG. 12E1
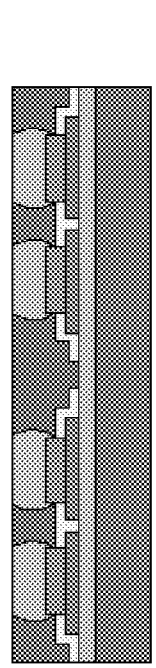
FIG. 12F
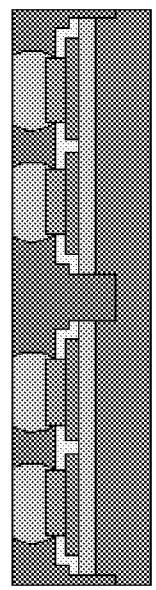
FIG. 12F1
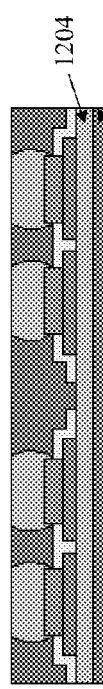
FIG. 12G
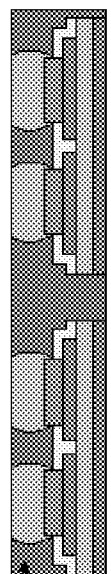
FIG. 12G1
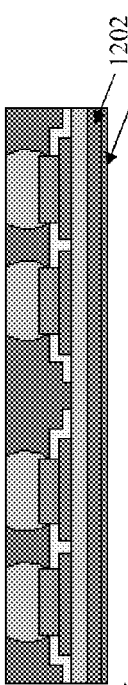
FIG. 12H
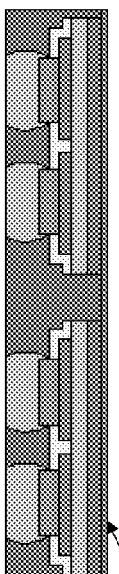
FIG. 12H1

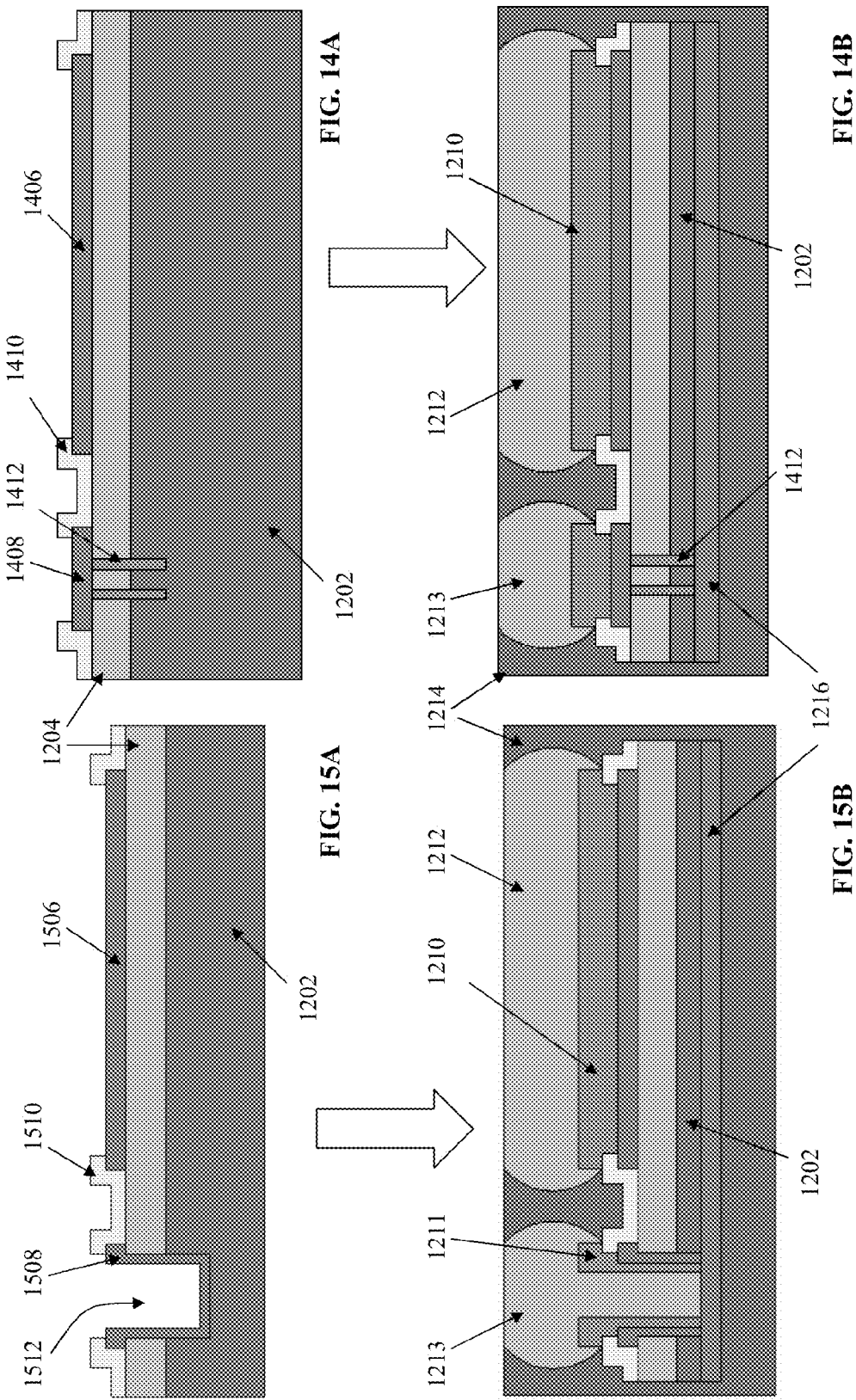

SUBSTRATELESS POWER DEVICE PACKAGES

PRIORITY CLAIM

This Application is a divisional of U.S. patent application Ser. No. 12/916,086, filed Oct. 29, 2010, to Tao Feng et al. entitled "SUBSTRATELESS POWER DEVICE PACKAGES", the entire disclosures of which are incorporated by reference herein.

FIELD OF THE INVENTION

This invention generally relates to ultra thin wafers and more particularly to substrate-less chips of vertical power semiconductor devices and a process for back metal deposition.

BACKGROUND OF THE INVENTION

Semiconductor devices face a number of challenges during the formation of a plurality of device package dies on a wafer. This is particularly the case for chip scale package metal oxide semiconductor field effect transistor (MOSFET) devices, especially vertical conduction power MOSFET devices having gate and source regions on one surface of a semiconductor substrate and a drain region on the opposite surface. Electrical connections are formed on the front surface of a given semiconductor device and electrical connections must additionally be formed on the back surface of the device. In a semiconductor package, electrical connections from both sides of the device must generally be extended to a common plane to allow for post-packaging use of the device. For semiconductor devices such as vertical conduction power MOSFET devices, it is desirable to work towards a smaller land pattern/minimized footprint and a smaller package thickness. This follows the industry trend of miniaturization of electronics, moving towards an optimal true chip scale package. It is similarly desirable to have a smaller electrical resistance, e.g., on resistance $R_{dson}$, associated with each semiconductor device package die. This may be accomplished by reducing the thickness of the semiconductor device package die. Since conduction occurs vertically through the semiconductor die, reducing the thickness of the semiconductor die will dramatically reduce the on resistance of the device.

Better thermal dissipation is another desirable feature for semiconductor device package dies, and this can be achieved by using bottom and top exposure. Another desired result is providing greater support to the semiconductor device. Greater stability associated with greater support will also minimize the risk of damaging the semiconductor device chip/substrate. Lastly, it is important that the fabrication of these semiconductor device package dies be accomplished as a wafer level batch process in order to maximize efficiency and minimize the time and costs needed to produce these semiconductor device package dies.

For semiconductor devices with multiple connections on one surface and at least one connection on the opposite surface (e.g., MOSFET device), achieving the desired features discussed above will require novel arrangement in extending connections to a common plane. It is also generally desirable to have simple, quick, and efficient methods of packaging semiconductor devices.

Typically, semiconductor wafers start out thick in order to provide structural support during wafer handling and the various processes involved in fabricating the semiconductor device. After the front side (device side) processes have been completed, the dies typically undergo a backgrinding process, to remove the back substrate portions. For integrated circuit (IC) chips, the wafer can be made extremely thin because little or no further wafer processing is required, since all the device components are located in the already complete front side of the wafer. However vertical conduction devices such as vertical power MOSFETs require further backside processing after the backside grinding, (e.g. etching, back metal formation, etc.), and so require more mechanical support to avoid wafer damage. Conventional methods have been developed to make ultra thin (e.g., about 2 to 4 mils) wafers/dies for vertical power devices. For perspective, 2 mils is about the diameter of a human hair and much thinner than a piece of paper. A wafer at this thickness or smaller is fragile and easy to damage. However, a thinner wafer can have a lower electrical resistance in vertical semiconductor devices, i.e., devices in which the current flow is vertical, i.e., perpendicular to the wafer surface. Reducing the wafer thickness is an effective way to reduce $B_{dson}$. The substrate electrical resistance may be 50% of the total $B_{dson}$ low voltage power trench MOSFET devices with a wafer thickness of 8 mils. The use of ultra thin wafers further ensures that the power devices can meet stringent total package thickness requirements. However, the thinner a vertical semiconductor wafer becomes, the higher the risk for damage (e.g. wafer cracking or chipping) during the backside processing and other post-backgrinding processes of the wafer. FIGS. 1A-1E are cross-sectional diagrams illustrating an example of 3M™ wafer support system for thinning and handling a wafer, such as Si or glass, by a spin coating method. As shown in FIG. 1A, a layer of UV resin or UV-cured liquid 106 is spun on to make a coating on a front surface 107 of a wafer 108 of a starting thickness of about 750 microns. The coated wafer is then turned upside down and is vacuum bonded to a support glass 102 with a Light-To-Heat-Conversion (LTHC) release compound 104 deposited between the support glass 102 and the UV resin coat 106. UV irradiation is applied to cure the resin coating. As shown in FIG. 1B, the wafer 108 is thinned by grinding its back surface 110 with a grinding wheel 112 down to, e.g., 20 microns. The resulting thinned wafer 108 with the attached support glass 102 is again turned upside down and positioned on a dicing tape 114 having dicing frame 116 for holding the wafer as shown in FIG. 1C. Laser irradiation is applied onto the LTHC release 104 in order to remove the support glass 102. As shown in FIG. 1D, the support glass 102 is removed from the UV resin layer 106 and the wafer 108. As shown in FIG. 1E, the UV resin layer 106 is peeled off from the thinned wafer 108. In this conventional method, wafer level thinning and handling can be handled easily and similar to full thickness wafer. However, there are some disadvantages associated with this method. For example, the adhesive 104, resin 106 and other polymeric material may outgas in a vacuum chamber during vacuum processing steps, such as metallization. The steps of de-attaching the handle wafer (support glass 102) may involve risk of wafer breakage. Finally, the total thickness variation (TTV) depends on the accuracy of the handle wafer thickness. This makes the handle wafer more expensive because the handle wafer can only be re-used a limited number of times.

Alternatively, self-supported ring grinding technique could be used to grind a central portion of wafer and leave support ring of unground wafer material at the edge. This technique provides mechanical support without having to use a handle wafer.

U.S. Pat. No. 7,776,746 discloses a method and apparatus for ultra thin wafer backside processing. As shown in FIG. 2, the apparatus 100 comprises an outer ring 110 of generally toroidal configuration that can be formed of any suitably rigid material such as metal or a semiconductor. Outer ring 110 may have any configuration and preferably has a rectangular cross section for facilitating the use of the apparatus with a clamp. The outer ring 110 may be sized to accommodate therewithin a wafer 140. The outer ring 110 may have an outer diameter of 8 inches to accommodate therewithin a 6-inch wafer. A high temperature grinding and/or dicing tape 120 can be affixed or otherwise adhered about the outer ring 110 on a bottom surface 145 thereof. The tape 120 may include a back grinding and/or dicing tape that can resist the temperatures associated with wafer backside processing such as metallization. The outer ring 110 provides a holding mechanism for, and rigid support to, the high temperature tape 120.

U.S. Pat. No. 6,162,702 discloses a self-supported ultra thin silicon wafer process. FIGS. 3A-3B show back side and cross-sectional views of a finished ultra thin silicon wafer indicating with the space between the concentric circumferences the thicker outer rim of the wafer. In this process a mask is used to form a self-supported ring or grid for ultra thin wafer. As shown in FIG. 3B, a silicon wafer 304 has an ultra thin central portion that is supported by a circumferential rim 302 of thicker silicon. The central region is thinned by conventional means using conventional removal apparatus. As an alternative method, the central portion is removed using a photoresist mask or a combination of a photoresist mask and a hard mask.

US patent publication No. 2009/0020854 discloses a process of forming ultra thin wafers having an edge support ring. The process provides an edge support ring having an angled inner wall compatible with spin etching the ultra thin central portion of a wafer after the back grinding process. Following the spin etch process, no drying process is necessary before loading the wafer into the vacuum chamber for back metallization and before the back metallization process. As shown in FIG. 4, which is a schematic diagram showing the flow of spin etch chemicals during a spin etch process, a wafer 80 includes a substantially non-linear angled inner wall 86 extending and curving upwardly from a plane of an ultra thin central portion 81 to a top 88 of an edge support ring 85 formed on a backside 89 thereof. Chemical etch and de-ionized water can be spun from the wafer 80 during the spin etch process as indicated by the arrows. The edge support ring 85 provides the benefits of reduced handling and processing of the wafer 80 during subsequent processing.

The advantages of the above conventional methods are that no other materials brought into vacuum chamber except for the semiconductor wafer itself, so concern over outgassing are reduced. In addition, TTV is better compared to handle wafer approaches and there is lower cost for consumables. Unfortunately, conventional automatic wafer handling systems are not necessarily designed for moving an ultra-thin wafer with support ring and thus may break the fragile ultra-thin portion of the wafer thereby destroying the wafer. Consequently, the wafer cannot be handled as a normal wafer and the standard wafer handling equipment has to be modified to accommodate the special structure with rings.

All of the foregoing prior art is related to thin wafer handling techniques. The assumption in these techniques is that "thin die" handling is not a problem. However, thin die handling could be a significant problem if the thickness of the wafer is reduced further, e.g., down to 1 mil or less, where the thinned wafer is extremely fragile and vulnerable to damage. Use of thinner wafers poses greater risks of breakage during processing and handling at both the wafer level and the die level. Thin wafer handling especially becomes an issue with vertical conducting semiconductors, because backside processing (e.g., metallization) is required on the fragile ultrathin wafer after the back grinding. None of the above approaches may be adequate for wafers this thin.

It is within this context that embodiments of the present invention arise. In addition, the need arises for an effective way to bring connection from the both front and back surfaces of the chip to a single plane for post-packaging use of the device.

BRIEF DESCRIPTION OF THE DRAWINGS

Other objects and advantages of the invention will become apparent upon reading the following detailed description and upon reference to the accompanying drawings in which:

FIGS. 1A-1E are cross-sectional views illustrating a process of grinding a backside of a wafer of the prior art.

FIGS. 3A-3B are bottom view and cross-sectional view respectively of an ultra thin wafer having a self-support ring of the prior art.

FIG. 4 is a cross-sectional view of an edge support ring used for forming ultra thin wafer of the prior art.

FIGS. 12A-12K and 12D1-12H1 are cross-sectional views illustrating the steps of a process of making a substrate-less common drain MOSFET CSP with wafer level molding of the type depicted in FIG. 9A according to an embodiment of the present invention.

FIGS. 14A-14B are cross-sectional views illustrating the first and last steps of a process of making a substrate-less single MOSFET CSP with wafer level molding of the type depicted in FIG. 10A according to an embodiment of the present invention.

FIGS. 15A-15B are cross-sectional views illustrating the first and last steps of a process of making a substrate-less single MOSFET CSP with wafer level molding of the type depicted in FIG. 11 according to an embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

For an ultra thin wafer of 1 mil thickness or less, it is preferred to have support from the front side of the device wafer/chip to enable wafer backside processing and wafer/chip standard handling.

Figure 2:
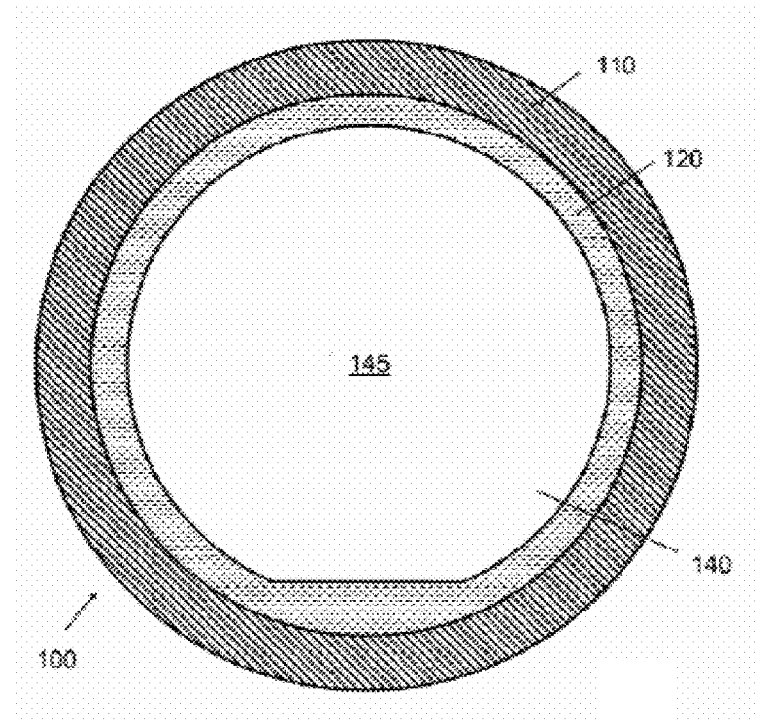
FIG. 2 is a top view of a wafer with a support ring for backside processing of the prior art.
Figure 3A:
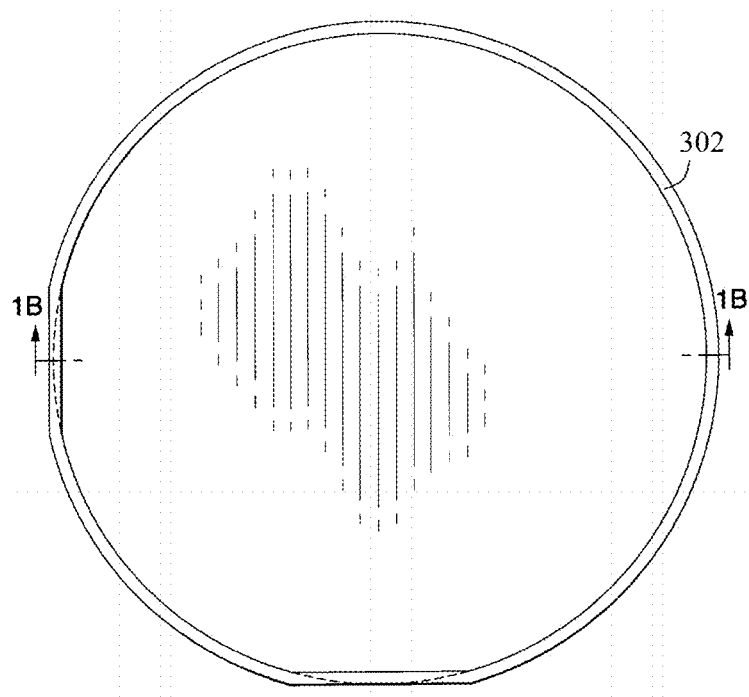
Figure 5:
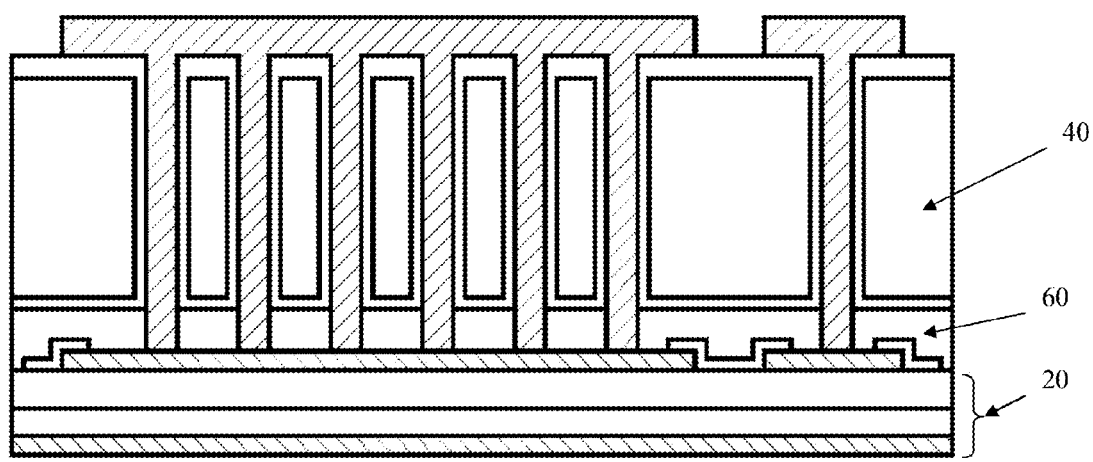
FIG. 5 is a cross-sectional view of a wafer with wafer bonding structure for wafer backside processing of the prior art.

Alpha and Omega Semiconductor Incorporated has developed a permanent wafer bonding structure, i.e., mechanical support chip, for each die that is included in the final product to support from front side of the die. U.S. patent application Ser. No. 12/749,696, entitled "Virtually Substrate-less Composite Power Semiconductor Device and Method" to Tao Feng et al., filed Mar. 30, 2010 discloses a virtually substrate-less composite power semiconductor device (VSLCPSD). As shown in FIG. 5, which is a cross sectional view of a virtually substrate-less composite power semiconductor device VSLCPSD, the VSLCPSD 1 has a sandwich structure having a power semiconductor device (PSD) 20, a front-face device carrier (FDC) or a support chip 40 and an intervening bonding layer (IBL) 60 made of an intervening bonding material. The PSD has back substrate portion, front semiconductor device portion with patterned front-face device metallization pads and a virtually diminishing thickness $T_{PSD}$. The FDC has a patterned back-face carrier metallization that provides electrical contact to the front-face device metallization pads, patterned front-face carrier metallization pads and numerous parallel-connected through-carrier conductive vias respectively connecting the back-face carrier metallizations to the front-face carrier metallization pads. The diminishing thickness $T_{PSD}$ effects a low back substrate resistance and the through-carrier conductive vias effect a low front-face contact resistance to the front-face device metallization pads. Vias formed in support chip allow extension of topside metallization through the support chip to the front side of the support chip. High conductivity of the metal in the vias means that the thickness of the support chip 40 does not adversely affect the electrical characteristics of the device. Support chip is about 200 microns (8 mil) thick, but the overall on-resistance $R_{dson}$ of the device is low because the PSD substrate is very thin, and because the metal in vias of the support chip has very low resistance.

Figure 6A:
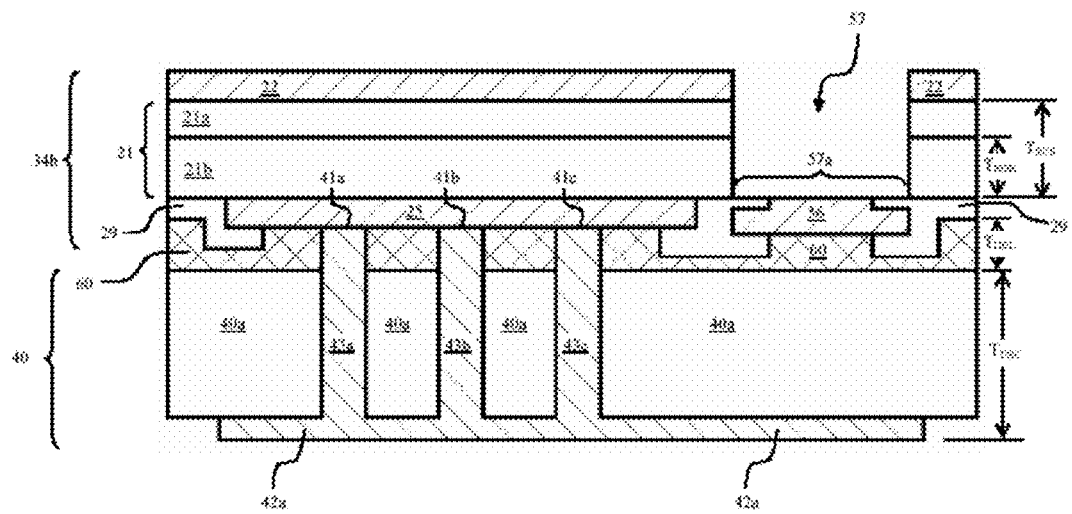
FIGS. 6A-6B are cross-sectional views of a wafer with an alternative bonding structure for wafer backside processing of the prior art.
Figure 6B:
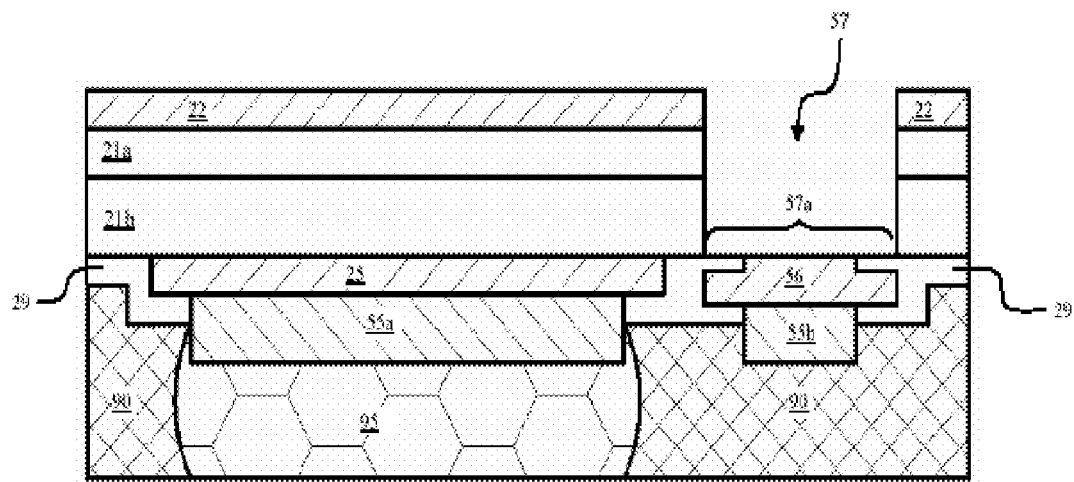

U.S. patent application Ser. No. 12/790,773, also of Alpha and Omega Semiconductor Incorporated, entitled "Semiconductor Device with Substrate-Side Exposed Device-Side Electrode and Method of Fabrication" to Tao Feng et al., filed May 28, 2010 discloses a substrate-less composite power semiconductor device similar to the one disclosed in U.S. patent application Ser. No. 12/749,696. FIG. 6A illustrates a cross sectional view of a bottom source power MOSFET having a support chip attached at a front side of the semiconductor device as similar as the virtually substrate-less composite power semiconductor device VSLCPSD of FIG. 5. As shown in FIG. 6A, the VSLCPSD has a sandwich structure having a power semiconductor device (PSD) 34b, a front-face device carrier (FDC) or a support chip 40 and an intervening bonding layer (IBL) 60 made of an intervening bonding material. The PSD 34b includes a semiconductor substrate (SCS) 21 with a bottom drain metal layer 22. The SCS 21 may comprise of a lightly-doped epitaxial drift layer 21b over a heavily-doped contact layer 21a. A substrate trench (TST) 57 has been extended through the SCS 21, reaching a substrate-side exposed device-side gate electrode (SEDGE) 56, which allows access to the gate electrode from the top surface, even after the chip has been flip chip mounted (i.e., mounted upside-down). FIG. 6B illustrates a cross sectional view of a bottom source power MOSFET similar to FIG. 6A but in which the support chip 40 is replaced with a molding compound 90 surrounding a solder bump 95.

In these techniques, TTV can be controlled through precision grinding of the silicon support wafer prior to bonding. However, there is a cost issue for doing through silicon via (TSV) etch on the support wafer, which is also time-consuming.

Embodiments of the present invention improve upon the general idea of the approaches described with respect to FIG. 5 and FIGS. 6A-6B, i.e. providing support from the front side of an ultra thin device wafer/chip, to facilitate both wafer process/handling and chip assembly. However, instead of using wafer bonding, embodiments of the present invention use a combination of solder bumping and a wafer level molding structure to achieve a greatly simplified process and significantly lower production cost. In addition, the approach used in embodiments of the present invention is also compatible with existing metal clip bonding assembly processes. In embodiments of the present invention, wafer level molding replaces the support chip and the solder bumps replace the through vias with even better electrical conductance.

Figure 7A:
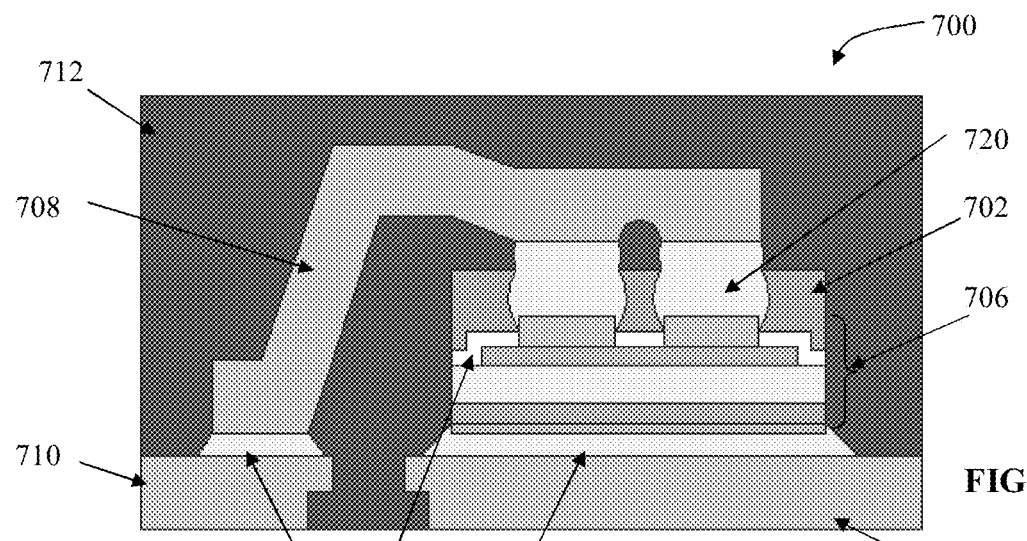
FIG. 7A is a cross-sectional view illustrating a power device package according to an embodiment of the present invention.
Figure 7B:
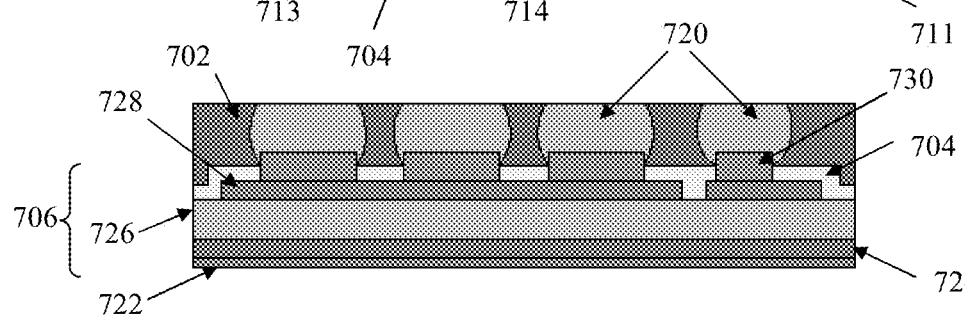
FIGS. 7B-7C are cross-sectional view and top view respectively of a substrate-less composite power device chip with wafer level molding of the package of FIG. 7A.
Figure 7C:
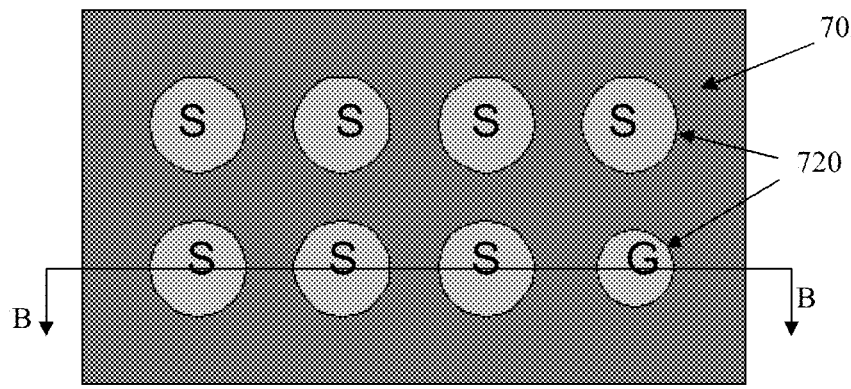

FIGS. 7A-7C are schematic diagrams illustrating different views of a substrate-less power device package 700 according to a first embodiment of the present invention. As shown in FIG. 7A, the device package 700 includes a substrate-less composite power device chip with wafer level molding 702 attached on front side of an ultra thin device chip 706. In this embodiment, the chip 706 may be a bottom drain, vertical conduction power MOSFET device. The internal structures of MOSFETs (e.g., source and body regions, gate structure, etc.) are well known in the art and are not specifically shown here for simplicity. Solder bumps 720 located within inner molding compound 702 electrically connect the front side of the chip 706 with a clip 708, (e.g. a source clip) that is connected to a lead frame portion 710 by a thin solder layer 713. Of course, the clip 708 could be replaced by any suitable external (external to the chip 706) conductive interconnector. The back side of the chip 706 is connected to a lead frame portion 711 with a thin solder layer 714. An outer molding compound 712 may encapsulate the chip 706, clip 708 and part of the lead frame as a single package.

FIG. 7B is a magnified view of an inner portion of the substrate-less power device package 700. As shown in FIG. 7B, the chip 706 includes a bottom metal 722, which may be electrically connected to a bottom drain of the chip 706, a heavily-doped substrate 724 located on top of the bottom metal 722 and a lightly-doped epitaxial (Epi) drift layer 726 located on top of the substrate 724. In this disclosure, the term 'substrate' can also be taken to mean the semiconductor material, e.g. the heavily doped substrate 724 and the lightly doped epitaxial layer 726. The heavily doped substrate 724 and the epitaxial layer 726 together may have a thickness less than 50 micron and or even less than 25 micron. With such a thin substrate, the device may be considered "substrateless". The Epi layer 726 may have a thickness of about several microns, typically 4-5 microns. The chip 706 also includes top metal 728, which may include a separate source electrode and gate electrode, located on top of the Epi drift layer 726. The top metal 728 may be separated into distinct source and gate metal regions, which can be electrically isolated from each other with a passivation layer 704. Solder bumps 720 and an optional under bump metallization (UBM) layer 730, which can be made of a solderable metal, can be formed at selected locations on the top metal 728, e.g., as shown in the top view of FIG. 7C. The UBM layer 730 may be used if the top metal 728 is a non-solderable metal (e.g., Aluminum metallization). The solderable UBM layer 730 can be formed on top of the top metal 728 to facilitate formation of the solder bumps. Usually, UBM layer may include Nickel (Ni), Gold (Au), or Copper (Cu).

The wafer level molding 702 is deposited on top of the structure between the solder bumps 720. By way of example and not by way of limitation, the wafer level molding may have a thickness higher than 150 microns. The wafer level molding 702 may be made of a molding compound. A thermal mismatch between the molding compound 702 and the chip 706 should not be too great to avoid wafer warpage. The degree of thermal mismatch can be determined experimentally for a given process. By way of example but not by way of limitation, the material used for wafer level molding 702 may include, molding powder, silicone gel, molding epoxy, high temperature polymers, epoxy, encapsulant or another molding compound. As seen in FIG. 7A, an additional outer molding compound 712 may surround the inner portion of the power device package 700.

Figure 8:
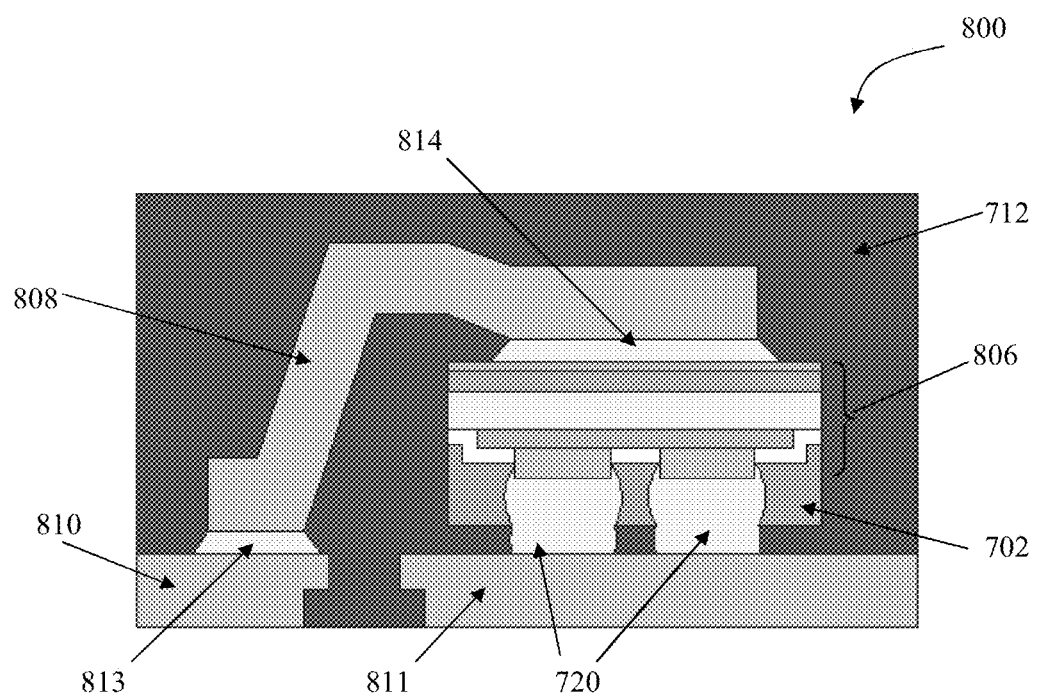
FIG. 8 is a cross-sectional view illustrating a power device package according to an alternative embodiment of the present invention.

FIG. 8 is a schematic diagram illustrating a cross-sectional view of a substrate-less power device package 800 according to a second embodiment of the present invention. Similar to the package 700 of FIG. 7A, the device package 800 includes a substrate-less composite power device chip with wafer level molding 702 attached on a top side of an ultra thin device chip 806. In this embodiment, the chip 806 may be a flip-chip power MOSFET device that is flip chip mounted in the package, i.e., mounted upside down on leadframe 811 compared to the chip 706 of FIG. 7A. Solder bumps 720 electrically connect the front side of wafer/chip 806 to a lead frame 811. The back side of the wafer/chip 806 is connected to a clip (e.g. drain clip) 808 by a thin solder layer 814. The drain clip 808 may be connected to a portion 810 of lead frame 811 by a thin solder layer 813. The lead frame 811 can be compatible with flip-chip on lead frame (FCOL) packaging. A molding compound 712 may encapsulate the whole structure as a single package.

The detailed structure of the chip 806 is similar to the chip 706 described in FIG. 7B. A front view of the substrate-less composite power device chip with wafer level molding of the package 800 is similar to the one of package 700.

Figure 9A:
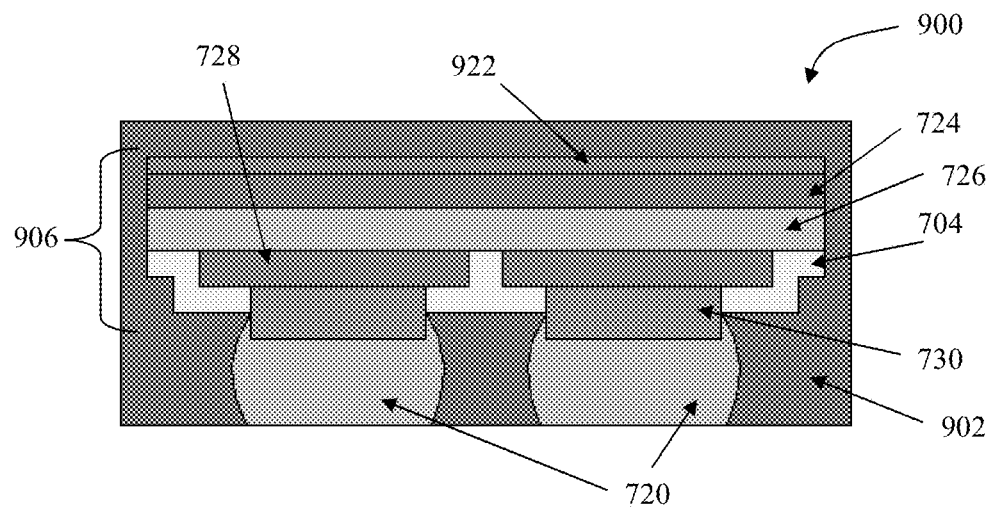
FIGS. 9A-9B are cross-sectional and top view respectively of a substrate-less common drain MOSFET CSP with wafer level molding according to an embodiment of the present invention.
Figure 9B:
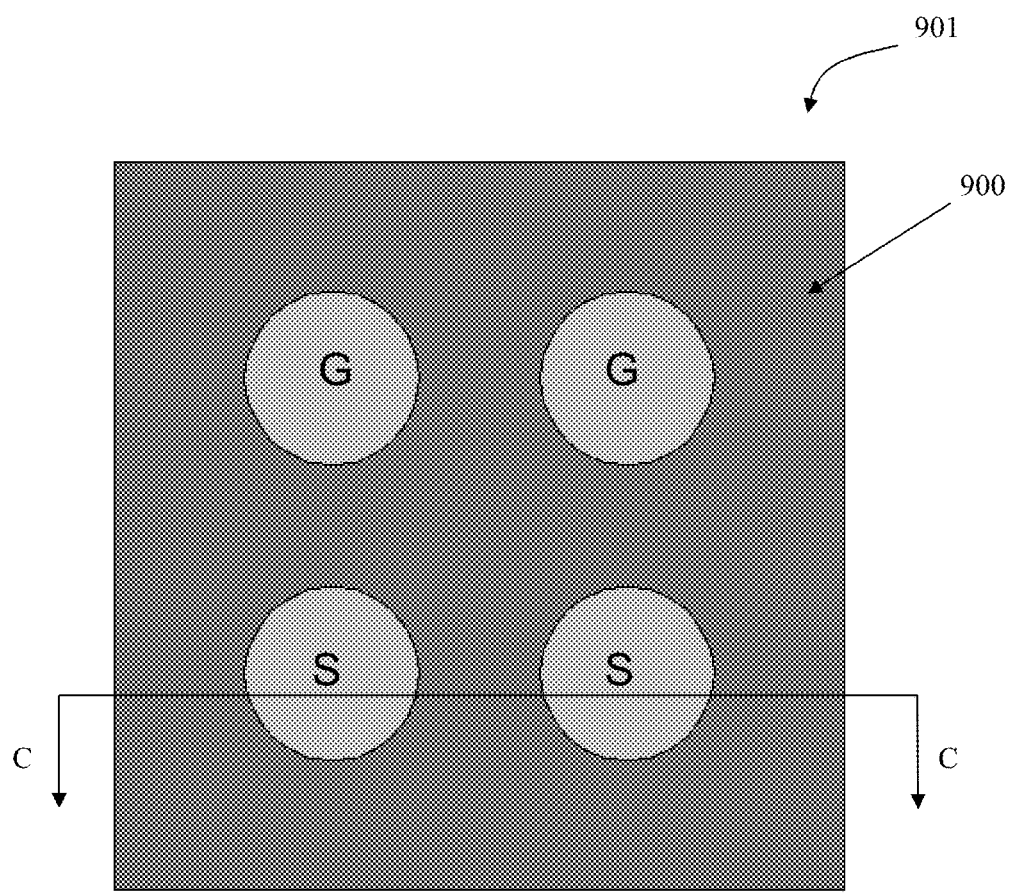

In a third embodiment of the present invention, a substrate-less power device package structure of the type depicted in FIGS. 7A and 8 can be applied to a substrate-less common drain dual MOSFET chip scale package (CSP). FIG. 9A is a cross-sectional view of a substrate-less common drain dual MOSFET CSP 900 with wafer level molding 902. The dual MOSFET CSP 900 includes two MOSFETs within the semiconductor die 906. Similar to the vertical MOSFET 706 of FIG. 7B, each of the vertical MOSFET of the common drain MOSFET CSP 900 includes a common bottom metal 922, a heavily-doped substrate 724 located on top of the bottom drain metal 922, a lightly-doped epitaxial (Epi) drift layer 726 located on top of the substrate 724, and top metal 728, which may include source electrodes and gate electrodes, located on top of the Epi drift layer 726 and connected to solder bumps 720 by UBM layer 730. The thickness of all the layers of each device is similar to those in the device 706 of FIG. 7B. In this embodiment, the bottom metal 922 provides a common drain metal for all the MOSFET devices formed in the substrate-less common drain MOSFET CSP 900. The substrate 724 and epi layer 726 may form part of the common drain. Wafer level molding 902 encapsulates the whole substrate-less common drain MOSFET CSP 900. FIG. 9B is a front view of substrate-less common drain MOSFET CSP 900 with wafer level molding 902 showing two neighboring devices. By way of example, FIG. 9A may be a cross sectional view, taken along line C-C of FIG. 9B. Although only two devices are shown for the sake of illustration, those of skill in the art will recognize that a number of devices can be formed on a chip with any suitable layout. In this figure, the common drain is not shown to be accessible; of course, the drain can be made accessible, if desired, by exposing back metal 922.

Figure 10A:
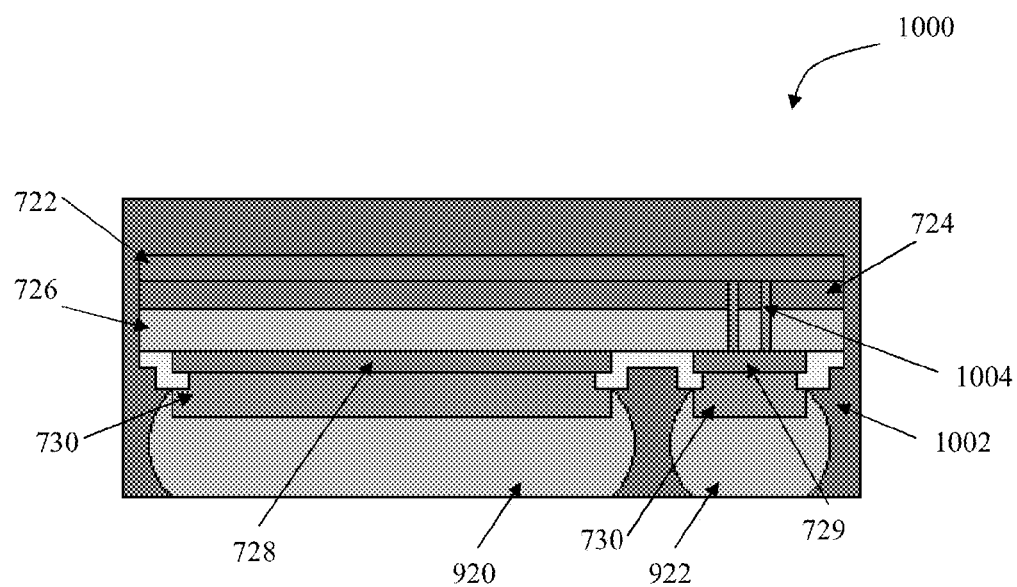
FIGS. 10A-10B are cross-sectional and top view respectively of a substrate-less single MOSFET CSP with wafer level molding according to an embodiment of the present invention.

In a fourth embodiment of the present invention, the substrate-less power device package structure of the type depicted in FIGS. 7A, 8A is also applied to a substrate-less single MOSFET chip scale package (CSP). FIG. 10A is a cross-sectional view of a substrate-less single MOSFET CSP 1000 with a wafer level molding 1002. The substrate-less single MOSFET CSP 1000 includes a bottom metal 722 (which may be bottom drain metal), a heavily-doped substrate 724 located on top of the bottom metal 722, a lightly-doped epitaxial (Epi) drift layer 726 located on top of the substrate 724, top metal 728, which may include source electrode and gate electrode, located on top of the Epi drift layer 726. As shown in FIG. 10A, the top electrodes 728 may be connected to solder bumps 920 by UBM layer 730. The thickness of all the layers in the device 1000 is similar to those in the device 706 of FIG. 7B. In this embodiment, through substrate vias (TSV) 1004 are formed through the substrate 724 and the Epi layer 726. A diameter of the TSV 1004 may be about 1 micron or more for a single TSV 1004. If there is more than one TSV 1004, the individual diameters may be smaller. The TSV 1004 can be filled with conductive material, such as Tungsten (W) or Copper (Cu) that electrically connects the back metal 722 with the front side of the CSP. The TSV 1004 can be electrically connected to solder bump 922 by portion 729 of top metal layer 728 and the UBM material 730. Wafer level molding 1002 can encapsulate the whole substrate-less single MOSFET CSP 1000. In this embodiment, there may not be a need to insulate TSV for drain connection to front side pad because the substrate is a drain. Of course, if desired, insulation material may line the TSV to insulate the conductive material within the TSV from the semiconductor material along the sidewalls of the TSV.

Figure 10B:
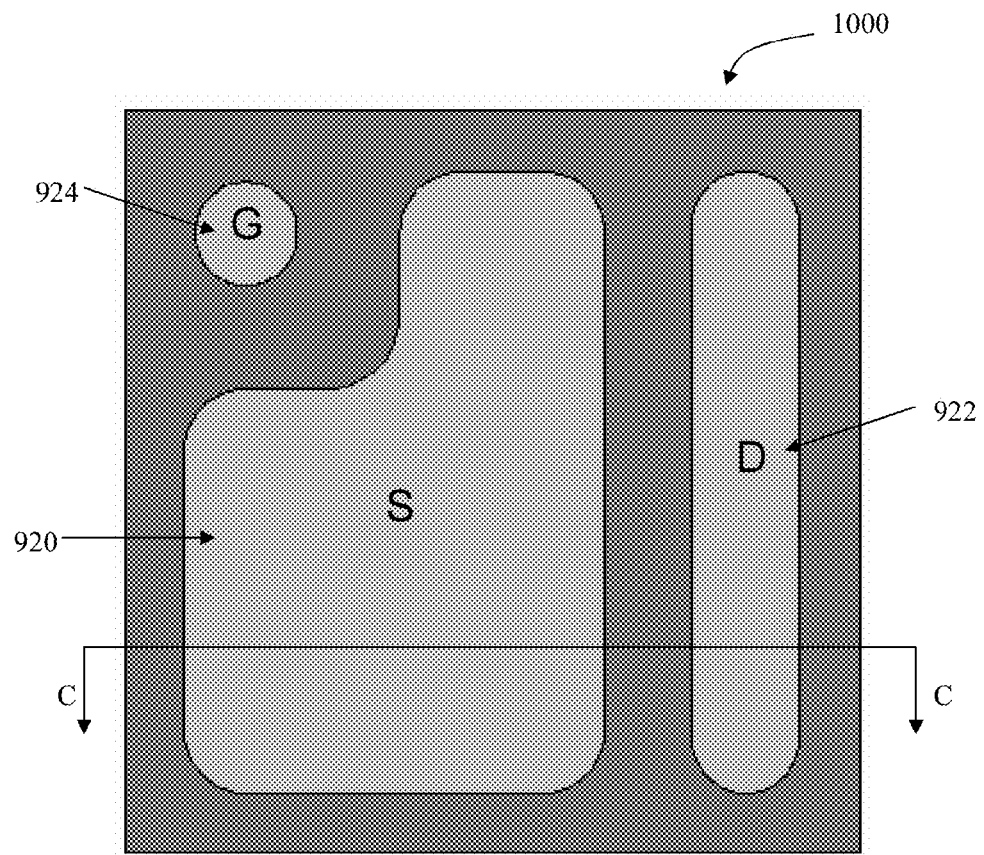

FIG. 10B is a front view of the substrate-less single MOSFET CSP 1000 with wafer level molding 1002, which includes source solder bumps 920, drain solder bumps 922 and gate solder bumps 924. It is noted that the cross-section in FIG. 10A is taken along line C-C of FIG. 10B. With the back side routed up to the front side by TSV 1004, all the device electrodes (e.g. source, gate, and drain) are accessible from the front side of the device.

Figure 11:
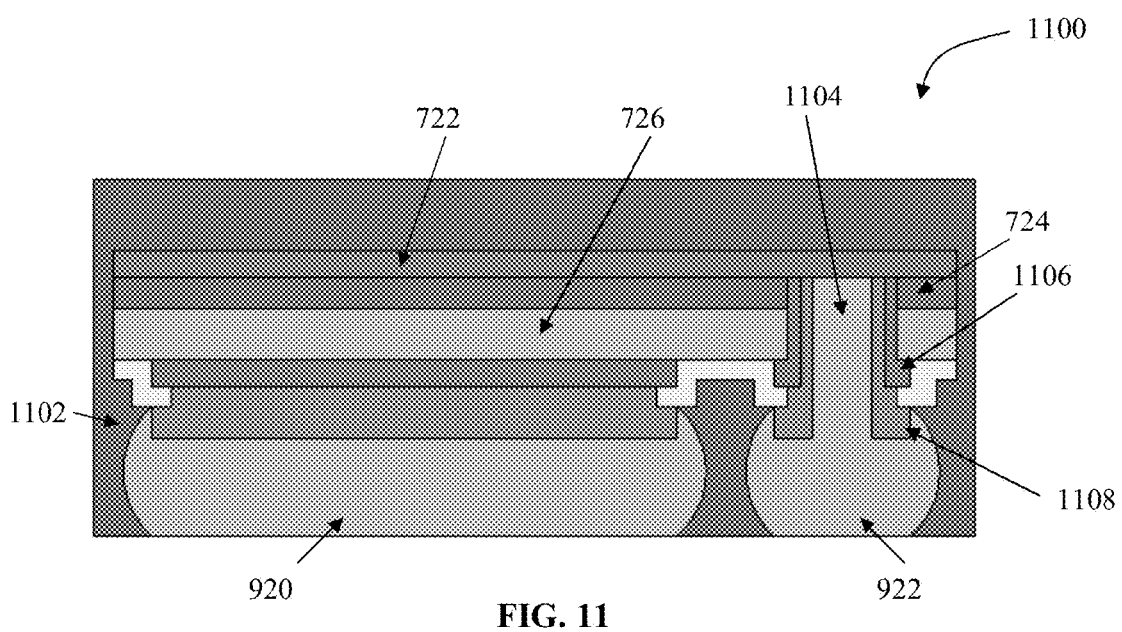
FIG. 11 is a cross-sectional of a substrate-less single MOSFET CSP with wafer level molding according to an alternative embodiment of the present invention.

FIG. 11 is a cross-sectional view of an alternative substrate-less single MOSFET CSP 1100 with a wafer level molding 1102 according to a fifth embodiment of the present invention. The layer structure of the CSP 1100 is similar to the CSP 1000 of FIG. 10A except only one big TSV 1104 is formed through the substrate 724 and the Epi layer 726. A diameter of the TSV 1104 may be about 5-20 microns. Solder material can be filled inside the TSV 1104 to connect the back metal 722 with the front side of the CSP 1100 and to form drain solder bumps 922 on top of the TSV 1104. By way of example, a metal layer 1106 and a UBM layer 1108 can be formed at the sidewall of the TSV 1104 with the metal layer 1106 adjacent to the substrate 724 and the Epi layer 726, and the UBM layer 1108 adjacent the solder inside the TSV 1104. Wafer level molding 1102 can encapsulate the whole substrate-less single MOSFET CSP 1100. The solder may be directly deposited over backside metal in the via since the backside metal may include a solderable metal such as an alloy of Titanium, Nickel, and Silver (TiNiAg).

Figure 12A:
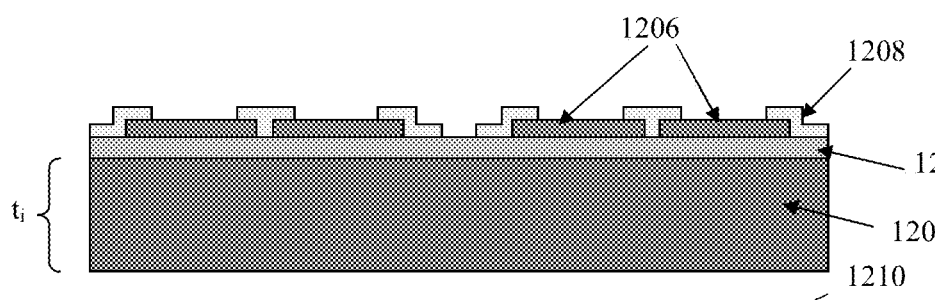

Examples of process flows for making a substrate-less MOSFET CSP with wafer level molding of the type depicted in FIGS. 9A-9B are shown in FIGS. 12A-12K and 12D1-12H1 according to embodiments of the present invention. The process can start with a power MOSFET with a full thickness wafer, e.g., having an initial thickness $t_i$ of about 750 microns. FIG. 12A is a cross-sectional view of the CSP which may be similar to the type depicted in FIG. 9B along a line A-A, which shows two neighboring devices for the sake of non-limiting example. As shown in this figure, top metal layer 1206, which may include source and gate electrodes, are located on a common Epi layer 1204 that is located on a common substrate 1202. The portions of metal layer 1206 can be insulated from each other by passivation material 1208, e.g., nitride or oxide.

Figure 12B:
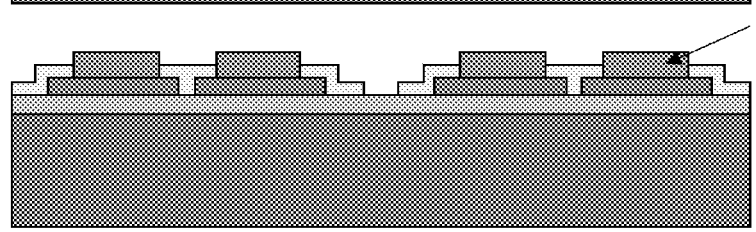
Figure 12C:
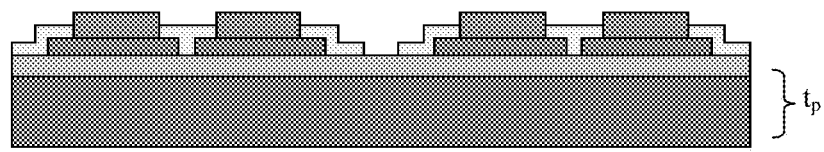

As shown in FIG. 12B, a UBM layer 1210 can be formed on top of the metal layers 1206 at openings in the passivation material 1208. By way of example, the substrate 1202 can then be pre-ground on its backside to a predetermined thickness $t_p$, e.g., 500 microns, as shown in FIG. 12C. Bumps 1212, preferably solder bumps, can then be formed on top of the bonding material 1210 as shown in FIG. 12D. Wafer level molding 1214 can be formed over the solder bumps 1212 as shown in FIG. 12E. Top portions of the wafer level molding 1214 and the solder bumps 1212 can be ground down to expose the solder bumps 1212 as shown in FIG. 12F.

The substrate 1202 can then be ground down on its backside again to reduce the thickness of the substrate such that the total thickness of the substrate 1202 and the Epi layer 1204 is ultra thin, e.g., less than about 25 microns, as shown in FIG. 12G. A thin metal layer 1216, such as TiNiAg or any other metal, is formed at the backside of the substrate 1202 as shown in FIG. 12H.

Figure 12I:
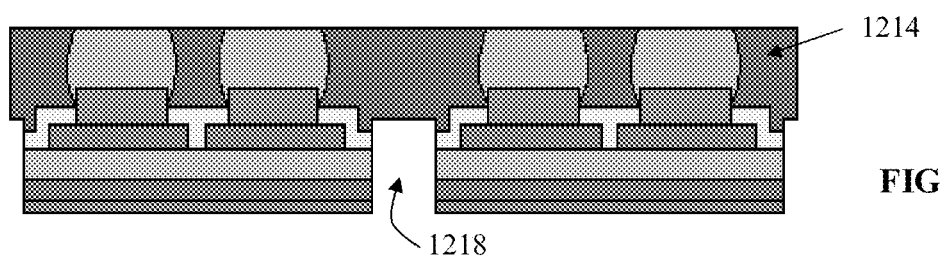
Figure 12J:
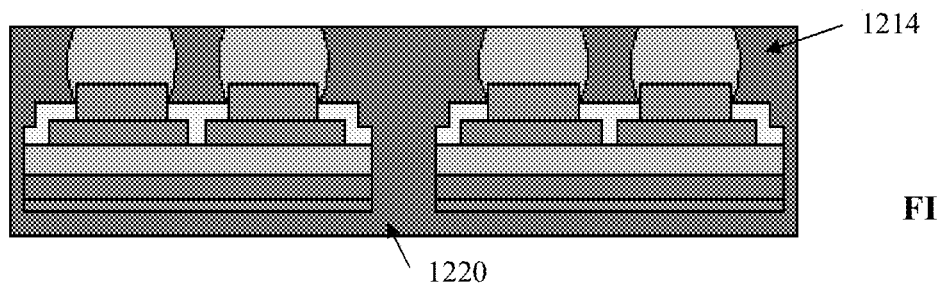
Figure 12K:
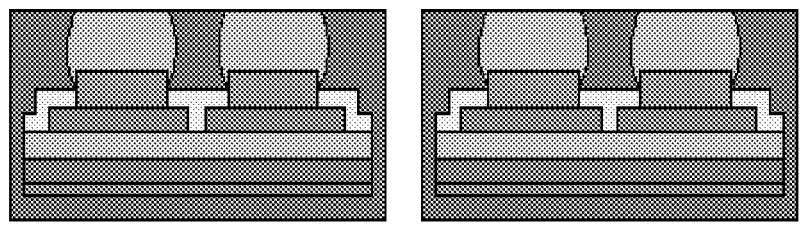

As shown in FIG. 12I, grooves 1218 can be formed on the backside of the structure by sawing through the metal layer 1216, the substrate 1202, the Epi layer 1204 and the passivation layer 1208 at scribe lines with a wide saw blade such that the semiconductor material is separated, but the wafer level molding 1214 still keeps the wafer together. A width of the grooves 1218 is preferably larger than about 25 microns. Wafer level molding 1220 can then fill in the grooves 1218 and also coat the sides and backside of the wafer as shown in FIG. 12J. The wafer can be separated into individual substrate-less common drain MOSFET CSP with wafer level molding can separated by sawing the structure through the scribe lines with a thinner saw blade as shown in FIG. 12K.

Alternatively, to minimize the warpage of the wafer, an additional step of forming grooves 1213 can be performed after the solder bumps have been formed shown in FIG. 12D. As shown in FIG. 12D1, after the step shown in FIG. 12D, grooves 1213 can be formed by partially sawing through the Epi layer 1204 and a top portion of the heavily doped substrate layer 1202 at scribe lines of the wafer. The diameter of the grooves 1213 can be larger than 25 microns. The steps shown in FIGS. 12E-12H can then be replaced by the alternative steps depicted in FIGS. 12E1-12H1.

As shown in FIG. 12E1, wafer level molding 1214 is formed over the solder bumps 1212 and inside the grooves 1213. Top portions of the wafer level molding 1214 and the solder bumps 1212 can be ground to expose the solder bumps 1212 as shown in FIG. 12F1. The substrate 1202 can then be ground down on its backside again to reduce the thickness such that the total thickness of the substrate 1202 and the Epi layer 1204 is less than about 25 microns as shown in FIG. 12G1. This backgrinding step also separates the semiconductor portion (i.e. substrate 1202 and Epi layer 1204) of the individual dies from each other by reaching grooves 1213, though they are still held in place by the wafer level molding 1214. A thin metal layer 1216 can be formed at the backside of the substrate 1202 as shown in FIG. 12H1. This process can then continue with the same steps as described in FIGS. 12J-12K, which include forming a coating at the backside of the wafer with the wafer level molding 1220 and separating individual substrate-less common drain MOSFET CSP with wafer level molding by sawing the structure through the grooves 1218. Optionally, the backside metal layer 1216 may be left exposed.

Figure 13A:
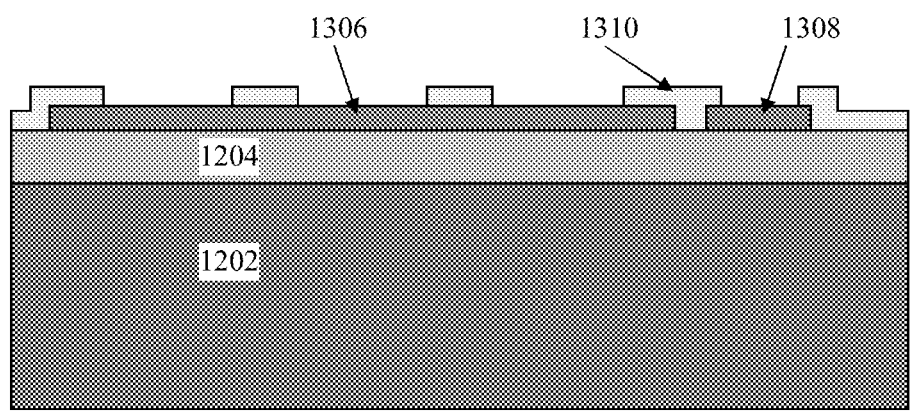
FIGS. 13A-13B are cross-sectional views illustrating the first and last steps of a process of making a substrate-less composite power device chip with wafer level molding of the type depicted in FIG. 7A according to an embodiment of the present invention.
Figure 13B:
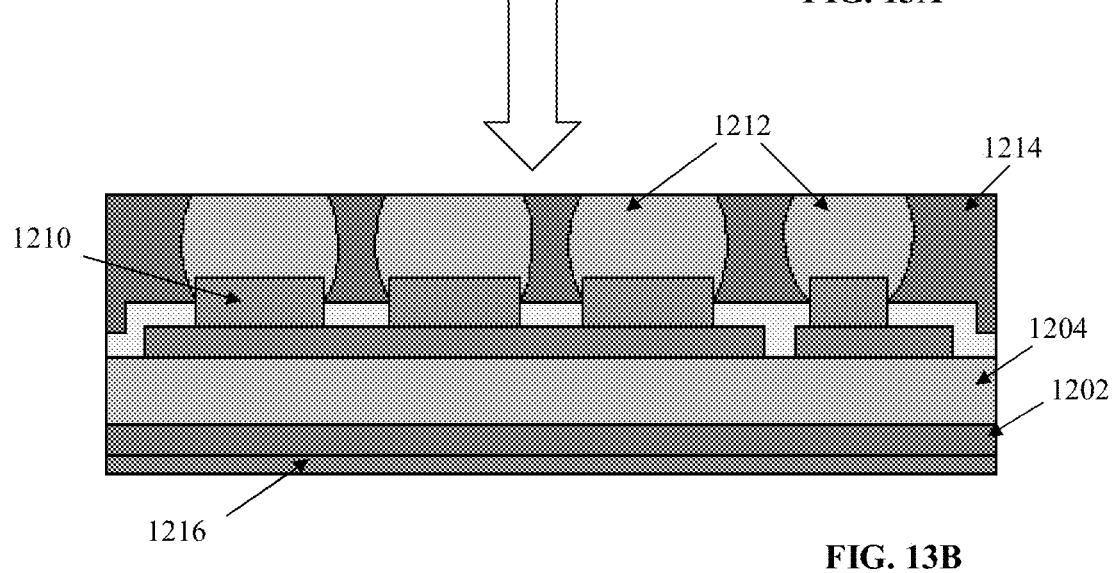

According to another embodiment of the present invention, a process flow to form substrate-less composite power device chip with wafer level molding of the type depicted in FIGS. 7A-7C and 8 may be basically similar to the process flow as shown above in FIGS. 12A-12K. The process may start with a wafer that includes a plurality of the substrate-less composite power MOSFET devices with a full thickness wafer, e.g., a thickness of about 750 microns. FIG. 13A is a cross-sectional view of one power MOSFET device of the type depicted in FIG. 7C along a line B-B. As shown in this figure, a top metal layer may be divided into a first portion 1306, which may be a source electrode, and a second portion 1308, which may be a gate electrode. The first and second portions of the top metal layer are located on a common Epi layer 1204 that is located on a common (heavily doped) substrate 1202. The metal layer portions 1306, 1308 are insulated from each other by passivation layer 1310. The next steps of this process are similar to the steps as shown above in FIGS. 12B-12H. FIG. 13B is a cross-sectional view of the substrate-less composite power MOSFET device, which has a total thickness of the substrate 1202 and the Epi layer 1204 is less than about 25 microns, with the solder bumps 1212 deposited on top of UBM layer 1210, the wafer level molding 1214 formed over the solder bumps 1212 and grinded to expose the solder bump, and a metal layer 1216 deposited at the backside of the substrate 1202. The individual substrate-less composite power MOSFET devices are separated from each other by sawing the wafer at the scribe lines. The resulting structure shown in FIG. 13B is compatible with metal clip bond packaging for existing silicon chips. The individual substrate-less composite power MOSFET device is then mounted onto a leadframe in a power semiconductor package with a metal clip, either source clip of drain clip connecting an outward facing electrode to a portion of the leadframe, as shown in FIGS. 7A and 8A. An outer molding compound can then encapsulate the chip and the clip, as shown in FIGS. 7A and 8A. Alternatively, bond wires, conductive ribbons, or other conductive interconnections may be used to connect the outward facing side of the die to the leadframe.

A process flow to form substrate-less single MOSFET CSP with wafer level molding like the types depicted in FIGS. 10A-10B and 11 are basically similar to the process flow as shown above in FIGS. 12A-12K. The process may start with a wafer that includes a plurality of the substrate-less single power MOSFETs with a full thickness wafer, e.g., a thickness of about 750 microns, and a partial TSV lined with a metal formed through the Epi layer and a top portion of the substrate. FIG. 14A is a cross-sectional view of one power MOSFET device of the type depicted in FIG. 10B along a line C-C. As shown in this figure, a first top metal layer portion 1406, which can be a source electrode, and a second top metal layer portion 1408, which can be a gate electrode, are located on a common Epi layer 1204 that is located on a common substrate 1202. The metal layer portions 1406, 1408 can be electrically insulated from each other by a passivation material 1410. The TSV 1412 can be formed through the Epi layer 1204 and a top portion of the substrate 1202 and filled with a metal. A depth of the TSV 1412 is larger than a final total thickness of the Epi layer 1204 and the substrate 1202 so that TSV 1412 will be exposed after a final back grinding step. The TSV 1412 can be connected to a back metal layer 1216, which can be a bottom drain metal. The other steps of this process are similar to the steps as shown above in FIGS. 12B-12K. The individual substrate-less single MOSFET CSP is separated from each other by sawing the structure at the scribe lines (not shown). FIG. 14B is a cross-sectional view of the substrate-less single MOSFET CSP, which has a total thickness of the substrate 1202 and the Epi layer 1204 being ultrathin, e.g., less than 25 microns. The CSP further includes the solder bumps 1212 deposited on top of UBM layer 1210, a metal layer 1216 deposited at the backside of the substrate 1202, solder bump 1213 formed over the metal pad 1408 over TSV 1412, and the wafer level molding 1214 formed over the solder bumps 1212, 1213 and etched back to expose the solder bump. The wafer level molding 1214 may also coat the backside and sides of the die.

An alternative process flow to form substrate-less single MOSFET CSP with wafer level molding of the type depicted in FIG. 11 is basically similar to the process flow as shown above in FIGS. 12A-12K. The process is started with a wafer that includes a plurality of substrate-less single power MOSFETs with a full wafer thickness, e.g., a thickness of about 750 microns, a wide partial TSV formed through the Epi layer and a top portion of the substrate with a metal layer lining the bottom and the sidewalls of the TSV. FIG. 15A is a cross-sectional view of one power MOSFET device of the type depicted in FIG. 11. As shown in this figure, a top metal layer 1506, which can act as a source electrode, is located on a common Epi layer 1204 that is located on a common substrate 1202. A TSV 1512 is formed partially through the substrate. Side walls and bottom of the TSV 1512 can be covered with a metal layer 1508. The metal layers 1506, 1508 can be insulated from each other by passivation material 1510. A depth of the TSV 1512 is larger than the final total thickness of the Epi layer 1204 and the substrate 1202 so that TSV 1512 will be exposed after the final back grinding step and is connected to a back metal layer 1216, which may act as a bottom drain electrode. The other steps of this process are similar to the steps as shown above in FIGS. 12B-12K. However, solder is filled into the TSV 1512. Backgrinding exposes the bottom of the TSV. The individual substrate-less single MOSFET CSP is separated from each other by sawing the structure at the scribe lines (not shown). FIG. 15B is a cross-sectional view of the substrate-less single MOSFET CSP, which has a ultrathin total thickness of the substrate 1202 and the Epi layer 1204, e.g., less than 25 microns. The solder bump 1212 is deposited on top of UBM layer 1210 connected to the metal layer 1506. In this embodiment, the UBM layer 1211 is formed at the sidewall of the TSV 1512 and the solder is filled in the TSV 1512 forms a contact between the solder bump 1213 and the back metal layer 1216. Before the backgrinding, the wafer level molding 1214 is formed over the solder bumps 1212 and 1213 such that the solder bumps are exposed; wafer level molding may also cover the backside and sides of the die.

Figure 16A:
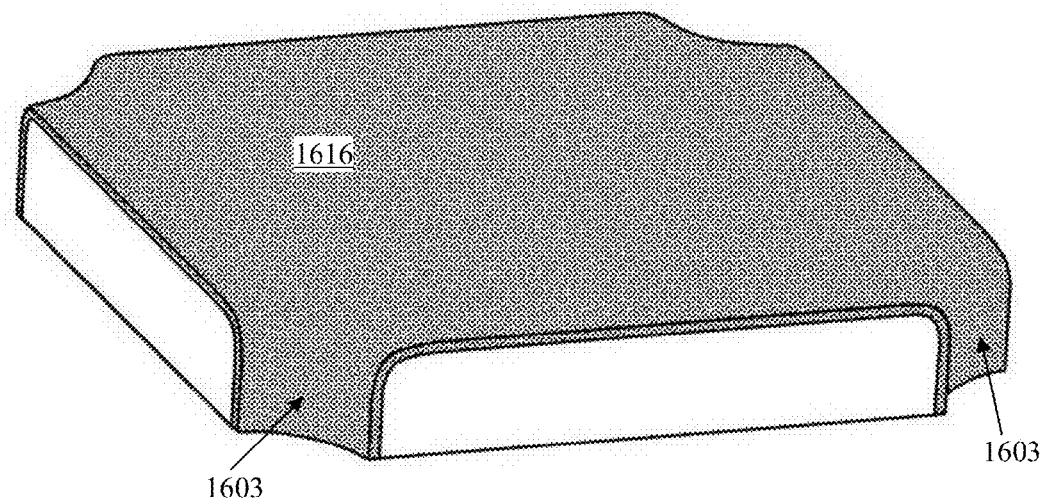
FIGS. 16A-16B are top and bottom perspective views illustrating alternative embodiments of this invention.
Figure 16B:
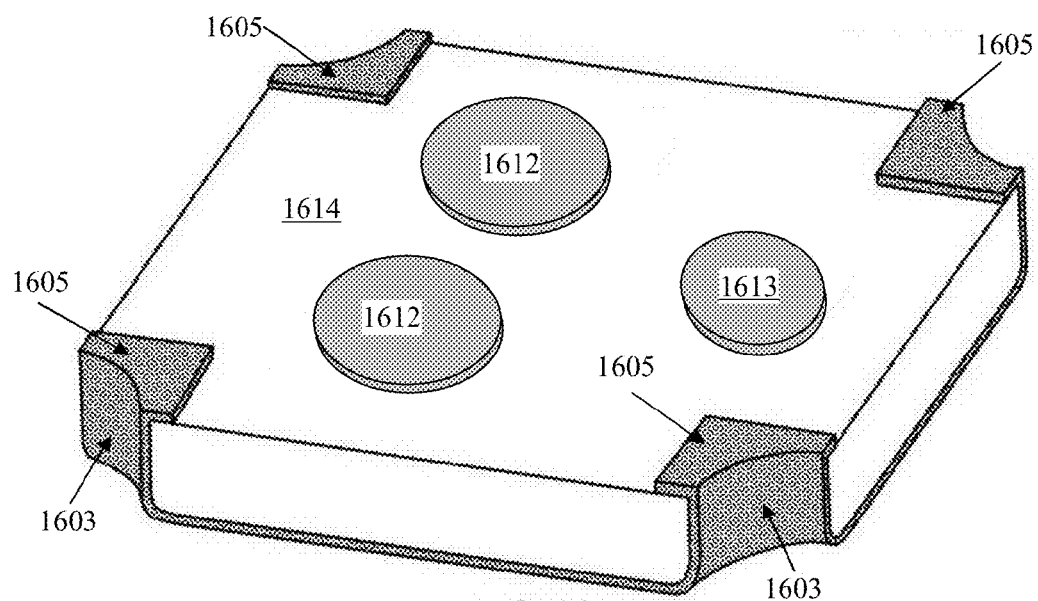

In yet another embodiment, the invention can be applied to a wafer level CSP in which electrical connection to the back of the die is routed to the front of the die on the outside of the die. The inventor, Tao Feng, disclosed one technique for accomplishing this in U.S. application Ser. No. 12/023,921, filed on Jan. 31, 2008 and published as U.S. Patent Application Publication Number 2009/0194880 A1, the contents of which are incorporated by reference. FIGS. 16A and 16B are bottom and top perspective views, respectively, of an embodiment of this invention that routes connection from the backside of the die to the front of the die. In this case, connection to the back side metal 1616 is electrically routed to front re-routed electrodes 1605 along re-routing paths 1603 along the sides of the die. As with the other embodiments, the front side electrodes may also include source electrode 1612 and gate electrode 1613, both formed from solder bumps encased by wafer level molding 1614, and the semiconductor substrate may be back grinded to be ultrathin in accordance with this invention. In this case, the re-routing paths 1603 may be formed by forming through holes at the sides or corners of the undiced wafer, then lining the holes with conductive material e.g., metal. Optionally, an insulating material may first be deposited in the holes to isolate the conductive material in the holes from the semiconductor substrate. After dicing, the holes become notches lined with conductive materials, thus forming the re-routing paths 1603.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC §112, ¶ 6. In particular, the use of "step of" in the claims herein is not intended to invoke the provisions of 35 USC §112, ¶ 6.

The reader's attention is directed to all papers and documents which are filed concurrently with this specification and which are open to public inspection with this specification, and the contents of all such papers and documents incorporated herein by reference.

What is claimed is:

1. A method for making a power semiconductor device, comprising:
   a) forming solder bumps on top of a top metal layer of a vertical conductive power semiconductor device wafer having the top metal layer located on a top surface of the wafer;
   b) forming a wafer level molding around the solder bumps, wherein the solder bumps extend above a top surface of the wafer level molding;
   c) grinding a back side of the device wafer to reduce a total thickness of a semiconductor material portion of the device wafer to a final thickness, wherein the wafer level molding has a thickness more than 3 times the final thickness; and
   d) forming a back metal on a back surface of the wafer.

2. The method of claim 1 wherein forming wafer level molding around the solder bumps further comprises:
   co-grinding a top portion of the wafer level molding and the solder bumps to at least partly expose the solder bumps.

3. The method of claim 1 wherein the final thickness is less than 25 microns.

4. The method of claim 1 further comprising:
   e) forming grooves on the back side of the vertical conductive power semiconductor device at scribe lines by partially dicing a wide groove, wherein the device wafer is still held together by the wafer level molding;
   f) filling the grooves with another wafer level molding; and
   g) dicing to separate individual packages.

5. The method of claim 1, further comprising forming grooves before b) on a top side of the vertical conductive power semiconductor device at scribe lines, wherein said grinding the back side of the device wafer in c) reaches the grooves and separates the semiconductor material portion of the devices.

6. The method of claim 1, wherein providing the vertical conductive power semiconductor device further comprises forming one or more at least partial through substrate vias (TSV) in the semiconductor material portion, and filling the TSV with a conductive material, whereby at the end of the process, the TSV routes electrical connection from a back side of the device to the front side of the device.

7. The method of claim 1, wherein providing the vertical conductive power semiconductor device further comprises forming one or more at least partial through substrate vias (TSV) filled with solder, whereby at the end of the process, the TSV routes electrical connection from a back side of the device to the front side of the device.

* * * * *